(12) United States Patent
Lin

(10) Patent No.: US 9,100,233 B2
(45) Date of Patent: Aug. 4, 2015

(54) BINARY SIGNAL DETECTION BASED ON NON-UNIFORM ADC

(71) Applicant: Realtek Semiconductor Corp., Hsinchu (TW)

(72) Inventor: Chia-Liang Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 42 days.

(21) Appl. No.: 14/096,045

(22) Filed: Dec. 4, 2013

(65) Prior Publication Data

US 2015/0156042 A1 Jun. 4, 2015

(51) Int. Cl.
*H04L 25/03* (2006.01)
*H03M 1/12* (2006.01)
*H03G 3/30* (2006.01)
*H03M 1/00* (2006.01)
*H04L 27/26* (2006.01)

(52) U.S. Cl.
CPC ........ *H04L 25/03885* (2013.01); *H03G 3/3036* (2013.01); *H03M 1/00* (2013.01); *H03M 1/12* (2013.01); *H04L 25/03057* (2013.01); *H04L 27/2647* (2013.01); *H04L 2025/03369* (2013.01); *H04L 2025/03535* (2013.01)

(58) Field of Classification Search
CPC ........... H03G 3/3036; H04L 25/03057; H04L 25/03885; H04L 27/2647; H03M 1/00; H03M 1/12
See application file for complete search history.

(56) References Cited

U.S. PATENT DOCUMENTS

| | | | |
|---|---|---|---|
| 6,289,063 B1* | 9/2001 | Duxbury | 375/348 |
| 6,498,577 B1 | 12/2002 | Lin | |
| 8,255,449 B2 | 8/2012 | Lin et al. | |
| 8,451,949 B2 | 5/2013 | Lin | |
| 2003/0058929 A1* | 3/2003 | Cox et al. | 375/150 |
| 2013/0057423 A1* | 3/2013 | Kurchuk et al. | 341/155 |
| 2014/0254709 A1* | 9/2014 | Flowers | 375/285 |

OTHER PUBLICATIONS

Verma et al, "A 10.3GS/s 6b Flash ADC for 10G Ethernet Applications," 2013 IEEE International Solid-State Circuits Conference Digest of Technical Papers, vol. 56, pp. 462-463.

* cited by examiner

*Primary Examiner* — Leon-Viet Nguyen
(74) *Attorney, Agent, or Firm* — McClure, Qualey & Rodack, LLP

(57) ABSTRACT

In an embodiment, a receiver comprises: a linear equalizer for receiving an input signal and outputting a partly equalized signal; a VGA (variable-gain amplifier) for receiving the partly equalized signal and outputting an amplitude-adjusted signal in accordance with a gain control signal; a non-uniform ADC (analog-to-digital converter) for receiving the amplitude-adjusted signal and outputting a digitized signal; and a DSP (digital signal processing) circuit for receiving the digitized signal and outputting a bit stream by performing a signal detection and establishing the gain control signal by performing an amplitude comparison. The non-uniform ADC has a lower precision when the amplitude-adjusted signal lies in a region where the signal detection is of a higher confidence, and has a higher precision when the amplitude-adjusted signal lies in a region where the signal detection is of a lower confidence. In an embodiment, the DSP circuit includes a decision feedback equalizer.

8 Claims, 3 Drawing Sheets

BINARY SIGNAL DETECTION BASED ON NON-UNIFORM ADC

TECHNICAL FIELD

The present invention relates to signal detection, and in particular, to signal detection for a binary signal.

BACKGROUND

Binary signaling is a popular scheme widely used in a serial data link; for instance, SATA (Serial Advanced Technology Attachment). In such a serial data link, a bit stream is transmitted at a certain nominal rate $f_s$ in accordance with a first clock signal; each bit within the bit stream represents either a logical "1" or a logical "0" (hereafter, "1" and "0") datum; a "1" is represented by a voltage of a first level of a certain nominal duration $T_s$, where $T_s=1/f_s$, while a "0" is represented by a voltage of a second level of the certain duration $T_s$; and as a result, the bit stream is represented by a voltage signal toggling back and forth between the first level and the second level in accordance with the bit stream to be transmitted. The voltage signal is received by a receiver via a channel (for instance, a cable). The channel usually disperses the voltage signal; the dispersion results in ISI (inter-symbol-interference), which needs to be corrected by the receiver in order to detect the bit stream accurately.

A functional block diagram of a receiver 100 of a serial data link is depicted in FIG. 1. Receiver 100 comprises: a linear equalizer 110 for receiving a dispersed signal and outputting an equalized signal; an ADC (analog-to-digital converter) 120 for receiving the equalized signal and outputting a digitized signal; and a DFE (decision feedback equalizer) 130 for receiving the digitized signal and outputting a recovered bit stream. The purpose of the linear equalizer 110 is to perform a preliminary equalization such that the ISI in the equalized signal is partly removed. There is, however, still some residual ISI that needs to be handled. DFE 130 effectively removes the residual ISI, so that the bit stream embedded in the digitized signal can be accurately detected. DFE 130 is a DSP (digital signal processing) circuit that processes the digitized signal generated by ADC 120. To accurately equalize the digitized signal, ADC 120 must have an adequate resolution. Prior art receivers usually demand ADC 120 to have at least 6-bits resolution for receiver 100 to work satisfactorily. For instance, for a serial data link of data rate of 10 Gb/s, a 6-bit ADC at a sampling frequency of 10 GHz is needed. It is very difficult to design such ADC. Therefore, receiver 100 is hard to implement for high speed serial data link.

SUMMARY

In an embodiment, a receiver comprises: a linear equalizer for receiving an input signal and outputting a partly equalized signal; a VGA (variable-gain amplifier) for receiving the partly equalized signal and outputting an amplitude-adjusted signal in accordance with a gain control signal; a non-uniform ADC (analog-to-digital converter) for receiving the amplitude-adjusted signal and outputting a digitized signal; and a DSP (digital signal processing) circuit for receiving the digitized signal and outputting a bit stream by performing a signal detection and establishing the gain control signal by performing an amplitude comparison. The non-uniform ADC has a lower precision when the amplitude-adjusted signal lies in a region where the signal detection is of a higher confidence, and has a higher precision when the amplitude-adjusted signal lies in a region where the signal detection is of a lower confidence. In an embodiment, the DSP circuit includes a decision feedback equalizer.

In an embodiment, a method comprises: receiving an input signal; performing a linear equalization on the input signal to generate a partly equalized signal; adjusting an amplitude of the partly equalized signal to generate an amplitude-adjusted signal in accordance with a gain control signal; converting the amplitude-adjusted signal into a digitized signal using a non-uniform ADC (analog-to-digital converter); performing a signal detection on the digitized signal to recover a bit stream embedded therein; and performing an amplitude comparison on the digitized signal with a threshold to establish the gain control signal. The non-uniform ADC has a lower precision when the amplitude-adjusted signal lies in a region where the signal detection is of a higher confidence, and has a higher precision when the amplitude-adjusted signal lies in a region where the signal detection is of a lower confidence. In an embodiment, performing the signal detection includes performing decision feedback equalization.

Other systems, methods, features, and advantages of certain embodiments of the present invention will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of certain embodiments of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

The present invention relates to signal detection, in particular for signal detection of a binary signal. For instance, certain embodiments of the invention comprise a method to relax the requirement on the ADC for a high speed serial data link. While the specification describes several example embodiments of the invention considered best modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1:
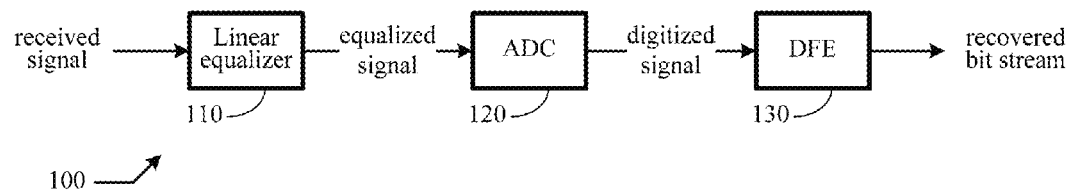
FIG. 1 shows a functional block diagram of a receiver for a serial data link.
Figure 2A:
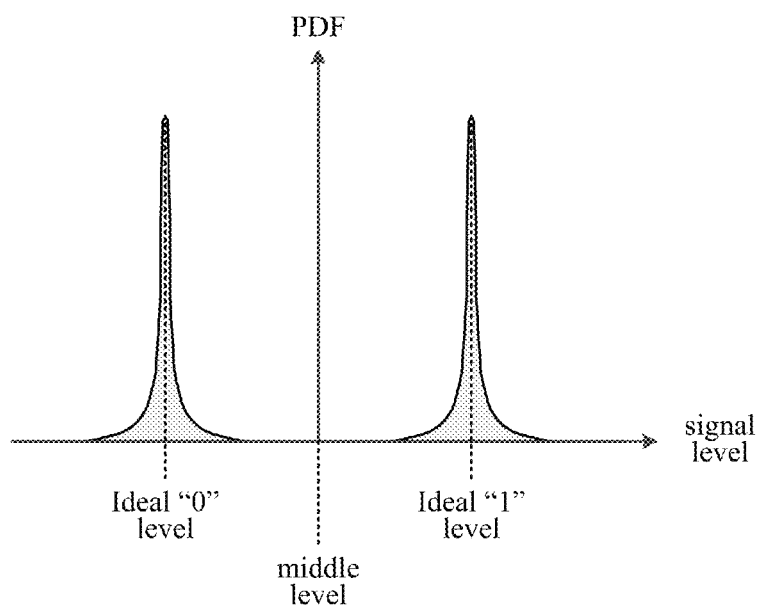
FIG. 2A shows a probability distribution function of a binary signal without pronounced impairments.
Figure 2B:
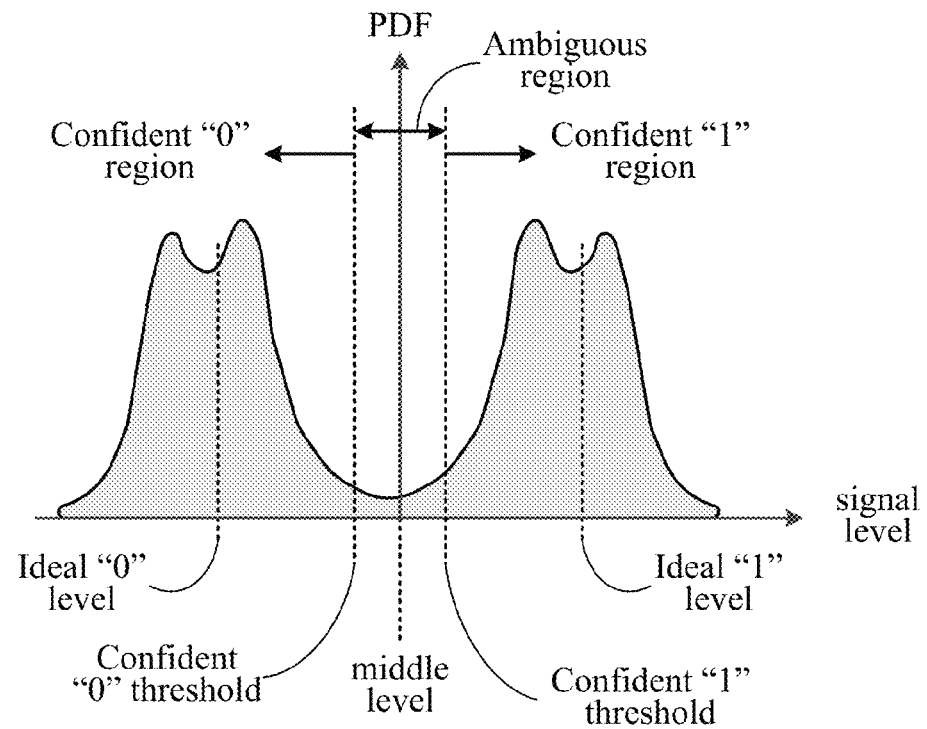
FIG. 2B shows a probability distribution function of a binary signal with pronounced impairments.

Consider a signal received by a receiver in a serial data link. An ideal signal in a serial data link has two distinct levels: one is an ideal "0" level representing a "0" datum, and the other is an ideal "1" level representing a "1" datum. Due to noises and other impairments, however, the signal received is not ideal and may deviate from the two distinct levels. As long as the signal doesn't deviate too much from the ideal level at which it is supposed to be, one can still correctly detect the datum that the signal represents. FIG. 2A shows a typical PDF (probability distribution function) of a level of a binary signal when the impairments are not very pronounced. In this case, one can still accurately detect the binary signal by simply comparing the signal level with a middle level, which is an average of the ideal "1" level and the ideal "0" level. With more pronounced impairments, such as post-cursor ISI, the signal level can remarkably deviate from the two distinct levels, as shown in FIG. 2B. However, the signal level is ambiguous and hard to detect only when it is near the middle level; when the signal is sufficiently higher than the middle level, it is said to be in a confident "1" region, where one is confident that the datum must be "1"; and when the signal is sufficiently lower than the middle level, it is said to be in a confident "0" region, where one is confident that the datum must be "0." Along this line of thinking, a confident "0" threshold is established, below which the signal is considered "0," and also, a confident "1" threshold is established, above which the signal is considered "1." The signal is said to be in an ambiguous region when its level is above the confident "0" threshold but below the confident "1" level; in this case, the signal is displaced too much (due to impairments) away from its ideal level, either "1" or "0," and thus becomes ambiguous and hard to detect in the ambiguous region. When the signal lies in the ambiguous region, signal processing is needed to help correctly detect the signal. In an embodiment, digital signal processing using decision feedback equalization is used to help correctly detect the signal. In order to perform digital signal processing, the signal must be first converted to digital samples using an ADC (analog-to-digital converter). Unlike the prior art, however, in certain embodiments of the present invention, a special-purpose ADC that is tailored for detecting a binary signal is used; this allows lowering the complexity of the ADC without compromising the quality of the digital signal processing of the binary signal.

Figure 3:
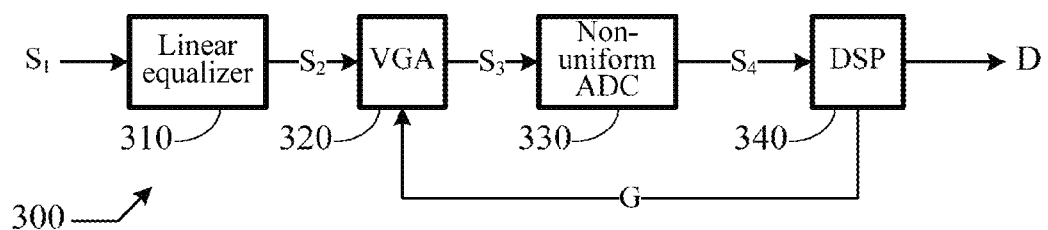
FIG. 3 shows a functional block diagram of a receiver for a serial data link in accordance with an embodiment of the present invention.

A functional block diagram of a receiver 300 in accordance with an embodiment of the present invention is depicted in FIG. 3. Receiver 300 comprises: a linear equalizer 310 for receiving an input signal $S_1$ and outputting a partly equalized signal $S_2$; a VGA (variable gain amplifier) 320 for receiving the partly equalized signal $S_2$ and outputting an amplitude-adjusted signal $S_3$ in accordance with a value of a gain control signal G; a non-uniform ADC (analog-to-digital converter) 330 for receiving the amplitude-adjusted signal $S_3$ and outputting a digitized signal $S_4$; and a DSP (digital signal processing) unit 340 for receiving the digitized signal $S_4$ and outputting the gain control signal G and a recovered bit stream D. Linear equalizer 310 provides a preliminary equalization on the input signal $S_1$ so that the ISI within is partly removed; the resultant partly equalized signal $S_2$ is closer to an ideal two-level (binary) signal in form. VGA 320 performs an amplitude adjustment on the partly equalized signal $S_2$ so that the resultant amplitude-adjusted signal $S_3$ is mostly around either an ideal "0" level or an ideal "1" level. Non-uniform ADC 330 performs an analog-to-digital conversion on the resultant amplitude-adjusted signal $S_3$ to generate the digitized signal $S_4$. DSP 340 performs a digital signal processing on the digitized signal $S_4$, removes the residual ISI, and accurately detects the bit stream D embedded in the digitalized signal $S_4$. Non-uniform ADC 330 differs from a conventional ADC in that the digitized levels are non-uniformly displaced, as described in the following paragraphs.

An ADC is an apparatus for converting an analog signal into a digital signal. If the ADC hypothetically has an infinite precision, then the digital signal will be exactly the same as the analog signal. In practice, the ADC has a finite precision, and the digital signal may deviate from the analog signal. The difference between the analog signal and the digital signal is known as "quantization noise," which depends on the precision of the ADC. In receiver 300 of FIG. 3, the amplitude-adjusted signal $S_3$ is an analog signal and the digitized signal $S_4$ is a digital signal, as far as non-uniform ADC 330 is concerned. Mathematically, one may relate $S_4$ to $S_3$ using the following equation:

$$S_4 = S_3 + \epsilon \quad (1)$$

Figure 4:
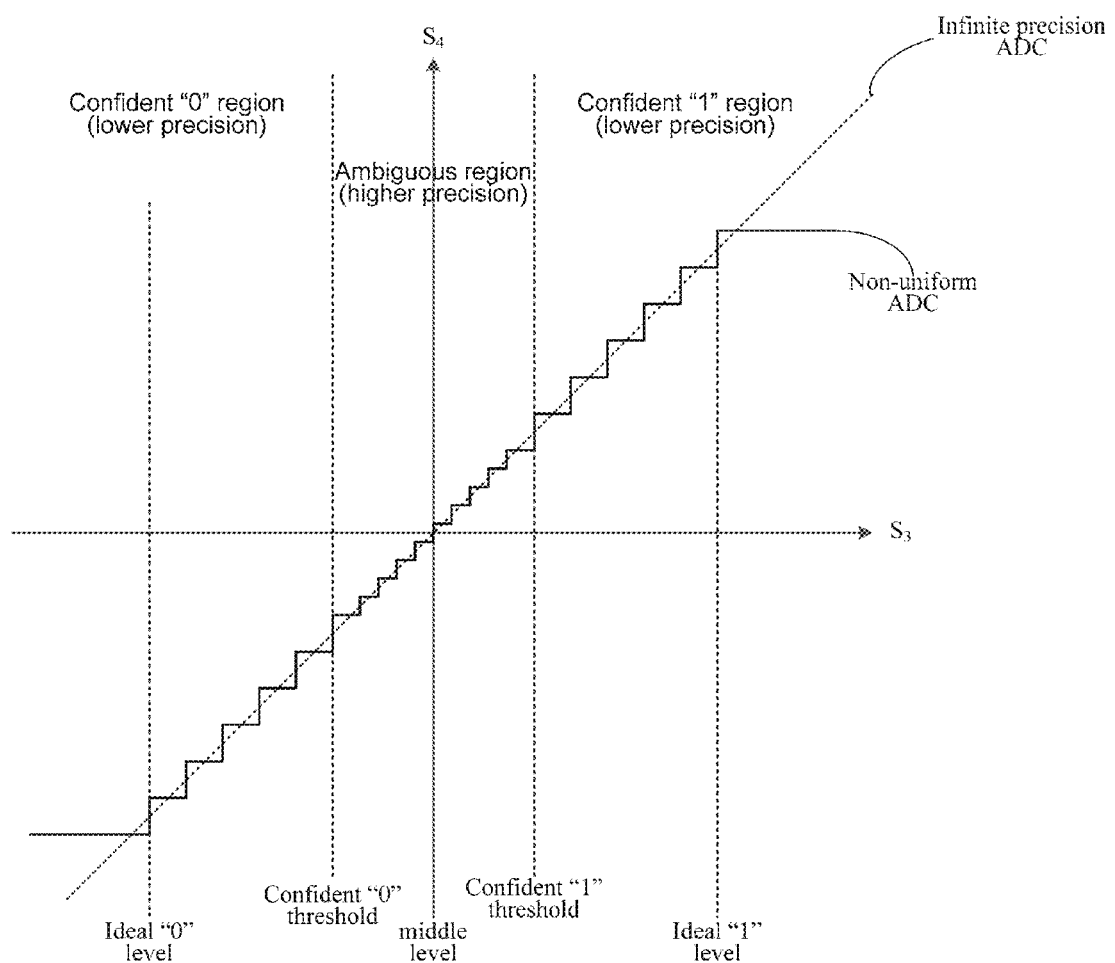
FIG. 4 shows transfer characteristics of a non-uniform ADC for the receiver of FIG. 3.

Here, $\epsilon$ is the quantization noise. The quantization noise is an additive noise that is an additional impairment. However, FIG. 2B suggests that, the additive noise is crucial only when the signal (here, $S_3$) lies in the ambiguous region, where the impairment is already serious and the signal is hard to detect. If the signal lies in either the confident "1" region or the confident "0" region, one will be very confident in detecting the signal; in this case, the quantization noise is not important. Therefore, it is a waste of effort to demand high-precision on analog-to-digital conversion when in fact there is no such need. Having that in mind, the non-uniform ADC 330 uses non-uniform quantization. In an exemplary embodiment, transfer characteristics of non-uniform ADC 330, from the amplitude-adjusted signal $S_3$ to the digitized signal $S_4$, are depicted in FIG. 4. For purpose of comparison, transfer characteristics of a hypothetical infinite-precision ADC (where there is no quantization noise and therefore $S_4$ is the same as $S_3$) is also shown in FIG. 4. When $S_3$ is above the confident "1" threshold, $S_3$ is in the confident "1" region, and the non-uniform ADC 300 has a lower precision (because of confidence that the signal must be "1" and therefore there is no need for higher precision); when $S_3$ is below the confident "0" threshold, $S_3$ is in the confident "0" region, and the non-uniform ADC 300 also has a lower precision (because of confidence that the signal must be "0" and therefore there is no need for higher precision); when $S_3$ is above the confident "0" threshold but below the confident "1" threshold, $S_3$ is in the ambiguous region, and the non-uniform ADC 300 has a higher precision (because further digital signal processing is needed to correctly detect the signal, therefore a higher precision is needed.)

Although in FIG. 4, non-uniform ADC 330 has uniform precision within each of the three regions (that is, the confident "0" region, the ambiguous region, and the confident "1" region), it is just by way of example but not limitation. Within each of the three regions, the precision doesn't necessarily need to be uniform. For instance, one can taper the precision within the ambiguous region, so that the precision is higher near the middle level, and lowered near the confident "0" threshold and the confident "1" threshold. Likewise, one can taper the precision within the confident "1" region, so that the precision is higher near the confident "1" threshold, and lower near the ideal "1" level. In any case, an average precision within the ambiguous region must be higher than an average precision within the confident "0" region and also higher than an average precision within the confident "1" region. Also, although in FIG. 4, non-uniform ADC 330 has characteristics that are anti-symmetrical (i.e., being an odd function) with respect to the middle level, it is just by way of example but not limitation. The characteristics don't necessarily need to be anti-symmetrical. In an alternative embodiment, an average precision is higher within the confident "0" than within the confident "1" region. In another embodiment, an average precision is higher within the confident "1" than within the confident "0" region.

Now refer to FIG. 3. DSP 340 performs automatic gain control (for establishing the control signal G) and signal detection (for generating the recovered bit stream D). A purpose of the automatic gain control is to properly set a value of the gain control signal G to control VGA 320 to adjust the amplitude for $S_3$ so that $S_4$ is mostly around either the ideal level "0" or the ideal level "1." If $S_4$ is mostly either above the ideal level "1" or below the ideal level "0", it indicates that the gain of VGA 320 is too high (i.e., the value of the gain control signal G is set too high.) In an embodiment, the control signal G is initialized to an initial value, and then updated by DSP 340 using the following algorithm:

If $S_4$ is more often above the ideal "1" level or below the ideal "0" level than above the "0" level but below the "1" level, decrease the value of G.

Else, increase the value of G.

For instance, a statistics on the $S_4$ is calculated once for every 100 samples. If 60 out of the 100 samples are either above the ideal "1" level or below the ideal "0" level (while the other 40 samples are above the "0" level but below the "1" level), the value of the gain control signal G is too large and thus needs to be decreased. On the other hand, if 45 out of the 100 samples are either above the ideal "1" level or below the ideal "0" level (while the other 55 samples are above the "0" level but below the "1" level), the value of the gain control signal G is too small and thus needs to be increased. Note that the above example is merely an illustration, and that other sample quantities and thresholds may be used and hence are contemplated to be within the scope of the disclosure.

In an embodiment, the signal detection is based on the following algorithm:

If $S_4$ is above the confident "1" threshold, set D to 1.
If $S_4$ is below the confident "0" threshold, set D to 0.
Else, performs a decision feedback equalization to equalize $S_4$ into $S_5$; if $S_5$ is above the middle level, set D to 1, else set D to 0.

Here, $S_5$ is an equalized signal generated by the decision feedback equalization. Decision feedback equalization is well known to those of ordinary skills in the art and thus not described in detail here. Those who are not familiar with decision feedback equalization may refer to standard text books, such as *Digital Communications* authored by Proakis and published by McGraw-Hill, Inc., New York.

In an alternative embodiment, the signal detection comprises performing a decision feedback equalization to equalize $S_4$ into $S_5$; if $S_5$ is above the middle level, set D to 1, else set D to 0. In this alternative embodiment, the signal detection is solely based on $S_5$, regardless of whether $S_4$ is above the confident "1" threshold or below the confident "0" threshold.

In an embodiment, the confident "1" threshold is a mean of the ideal "1" level and the middle level, while the confident "0" threshold is a mean of the ideal "0" level and the middle level. Some example values for the ideal levels, middle level, and confidence levels are described below. These values are merely illustrative, and not intended to be limiting. For instance, a signal detection is of the lower confidence when the amplitude-adjusted signal is sufficiently near a middle level, where sufficiently near may be a region between the two threshold levels. As another example, the signal detection is of the higher confidence when the amplitude-adjusted signal is sufficiently far away from a middle level, where sufficiently far away may be beyond a threshold value. In other words, sufficiency should be readily evident from FIGS. 2B and 4, and as illustrative from at least the example values below.

In an embodiment, the ideal "1" level is 200 mV; the ideal "0" level is −200 mV; the middle level is 0 mV; the confident "1" threshold is 100 mV; and the confident "0" threshold is −100 mV.

In an embodiment, the ideal "1" level is 200 mV; the ideal "0" level is −200 mV; the middle level is 0 mV; the confident "1" threshold is 50 mV; and the confident "0" threshold is −50 mV.

In an embodiment, the confident "1" threshold is a level above which the probability of error for setting D to 1 is 1%, and the confident "0" threshold is a level below which the probability of error for setting D to 0 is 1%.

VGA 320 of FIG. 3 is well known to those of ordinary skills in the art and thus not described in detail here. Those who are not familiar with implementation of a VGA may refer to the paper by Verma et al cited in the reference.

Linear equalizer 310 of FIG. 3 can be implemented by the continuous-time FIR circuit disclosed in U.S. Pat. No. 8,255,449.

Non-uniform ADC 330 of FIG. 3 can be implemented, for instance, by the circuit shown in U.S. Pat. No. 6,498,577. Note that the circuit shown in U.S. Pat. No. 6,498,577 is a piecewise linear, non-uniform ADC, while in this present invention it doesn't need to be piecewise linear.

Those skilled in the art will readily observe that numerous modifications and alterations of the device and method may be made while retaining the teachings of the invention. Accordingly, the above disclosure should be construed as limited only by the metes and bounds of the appended claims.

What is claimed:

1. An apparatus comprising:
   a linear equalizer for receiving an input signal and outputting a partly equalized signal;
   a VGA (variable gain amplifier) for receiving the partly equalized signal and outputting an amplitude-adjusted signal in accordance with a gain control signal;
   a non-uniform ADC for receiving the amplitude-adjusted signal and outputting a digitized signal, the digitized signal comprising digitized levels that are non-uniformly displaced; and
   a DSP (digital signal processing) circuit for receiving the digitized signal and outputting a recovered bit stream by performing a signal detection and establishing the gain control signal by performing automatic gain control, wherein the non-uniform ADC has a lower precision when a level of the amplitude-adjusted signal is sufficiently close to an ideal level corresponding to a logical "1" datum, sufficiently close to an ideal level corresponding to a logical "0" datum, or sufficiently different from a middle level of an ideal level corresponding to a logical "1" datum and an ideal level corresponding to a logical "0" datum, and the non-uniform ADC has a higher precision when the level of the amplitude-adjusted signal is sufficiently close to the middle level.

2. The apparatus of claim 1, wherein the signal detection comprises decision feedback equalization on the digitized signal when the level of the amplitude-adjusted signal corresponds to signal detection of a higher precision.

3. The apparatus of claim 1, wherein the signal detection comprises decision feedback equalization of the digitized signal.

4. The apparatus of claim 1, wherein the automatic gain control is based on a comparison of the digitized signal with a reference level.

5. A method comprising:
   receiving an input signal;

performing linear equalization on the input signal to generate a partly equalized signal;

adjusting an amplitude of the partly equalized signal to generate an amplitude-adjusted signal in accordance with a gain control signal;

converting the amplitude-adjusted signal into a digitized signal using a non-uniform ADC (analog-to-digital converter), the digitized signal comprising digitized levels that are non-uniformly displaced;

performing signal detection on the digitized signal to generate a recovered bit stream; and performing automatic gain control based on the digitized signal to establish the gain control signal, wherein the non-uniform ADC has a lower precision when a level of the amplitude-adjusted signal is sufficiently close to an ideal level corresponding to a logical "1" datum, sufficiently close to an ideal level corresponding to a logical "0" datum, or sufficiently different from a middle level of an ideal level corresponding to a logical "1" datum and an ideal level corresponding to a logical "0" datum, and the non-uniform ADC has a higher precision when the level of the amplitude-adjusted signal is sufficiently close to the middle level.

6. The method of claim 5, wherein performing the signal detection comprises performing decision feedback equalization on the digitized signal when the level of the amplitude-adjusted signal corresponds to signal detection of a higher precision.

7. The method of claim 5, wherein performing the signal detection comprises performing decision feedback equalization of the digitized signal.

8. The method of claim 5, wherein performing the automatic gain control is based on a comparison of the digitized signal with a reference level.

* * * * *